United States Patent
Holzmann et al.

(10) Patent No.: US 8,565,293 B2
(45) Date of Patent: Oct. 22, 2013

(54) METHOD FOR SYNCHRONIZING A PLURALITY OF MEASURING CHANNEL ASSEMBLIES AND/OR MEASURING DEVICES, AND APPROPRIATE MEASURING DEVICE

(75) Inventors: Gottfried Holzmann, Zorneding (DE); Werner Mittermaier, Erding (DE); Anton Steinegger, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 834 days.

(21) Appl. No.: 12/670,694

(22) PCT Filed: May 26, 2008

(86) PCT No.: PCT/EP2008/004178
§ 371 (c)(1),
(2), (4) Date: Apr. 22, 2010

(87) PCT Pub. No.: WO2009/012834
PCT Pub. Date: Jan. 29, 2009

(65) Prior Publication Data
US 2010/0207674 A1 Aug. 19, 2010

(30) Foreign Application Priority Data
Jul. 26, 2007 (DE) .......................... 10 2007 034 988
Sep. 27, 2007 (DE) .......................... 10 2007 046 300

(51) Int. Cl.
*H04B 3/46* (2006.01)
*H04L 7/04* (2006.01)

(52) U.S. Cl.
USPC .......................................... 375/226; 375/354

(58) Field of Classification Search
USPC ......... 375/226, 293, 294, 326, 327, 354, 356, 375/358, 371, 373, 375, 376; 327/144, 146, 327/147, 149, 150, 155, 156, 158, 159, 327/161; 713/500–503, 600
See application file for complete search history.

(56) References Cited

U.S. PATENT DOCUMENTS

| | | | |
|---|---|---|---|
| 4,928,278 A | 5/1990 | Otsuji et al. | |
| 2002/0073350 A1 | 6/2002 | Ehlert et al. | |
| 2003/0094934 A1* | 5/2003 | Date et al. | 324/73.1 |
| 2007/0168766 A1 | 7/2007 | Le et al. | |

OTHER PUBLICATIONS

International Preliminary Report on Patentability, PCT/EP2008/004178, Apr. 15, 2010, pp. 1-8.
International Search Report, WO 2009/012834 A3, May 29, 2009, pp. 1-6.

* cited by examiner

*Primary Examiner* — Young T. Tse
(74) *Attorney, Agent, or Firm* — Ditthavong Mori & Steiner, P.C.

(57) ABSTRACT

A method and a measuring device for synchronizing measuring channel assemblies are provided. A reference signal is produced by a reference signal source. The reference signal is supplied to the individual measuring channel assemblies of the measuring device. A clock signal generator is used to produce a clock signal at a low frequency, the clock signal generator being connected to each measuring channel assembly by a respective connecting line of the same length. The clock signal is supplied through a phase corrector element for the purpose of correcting the phase of the reference signal in each measuring channel assembly to the phase of the clock signal.

20 Claims, 3 Drawing Sheets

METHOD FOR SYNCHRONIZING A PLURALITY OF MEASURING CHANNEL ASSEMBLIES AND/OR MEASURING DEVICES, AND APPROPRIATE MEASURING DEVICE

CROSS-REFERENCE TO RELATED APPLICATION

The present application is a national phase application of PCT Application No. PCT/EP2008/004178, filed on May 26, 2008, and claims priority to German Patent Application No. 10 2007 034 988.4, filed on Jul. 26, 2007, and German Patent Application No. 10 2007 046 300.8, filed on Sep. 27, 2007, the entire contents of which are herein incorporated by reference.

BACKGROUND OF THE INVENTION

1. Field of the Invention

The invention relates to a method for synchronizing several measuring-channel assemblies of at least one measuring device, several measuring devices and to corresponding measuring devices.

2. Discussion of the Background

Measurements, for example, in modern mobile-radio systems have so far been implemented by mobile-radio measuring devices, which are operated either with a single channel or with several channels with a relatively inaccurate synchronisation. The synchronization is implemented via a synchronization signal within the range of, for example, approximately 10 MHz. However, a synchronization of this kind is not adequate for measurements with modern mobile-radio methods. In this context, a synchronization with an accuracy of less than 10 nanoseconds is required.

SUMMARY OF THE INVENTION

Accordingly, embodiments of the present invention advantageously provide a method for synchronizing several measuring-channel assemblies of a measuring device, several measuring devices and corresponding measuring devices, of which the synchronization is improved by comparison with the known measuring device.

The measuring device according to the invention for synchronizing several measuring-channel assemblies comprises at least two measuring-channel assemblies. In the measuring device, a clock signal is generated by a clock-signal source. The clock-signal source generating the clock signal is connected to every measuring-channel assembly of the measuring device, in each case via a connecting line, in such a manner that the clock signal is supplied to the measuring-channel assemblies. The connecting lines between the clock generator and the measuring-channel assembly here provide identical delay times. This is achieved, for example, with coaxial cables of identical length. Every measuring-channel assembly provides an assembly signal source for the generation of an assembly clock signal and a phase-corrector element, by means of which the assembly clock signal is corrected with regard to its phase position on the clock signal.

The method according to the invention has the advantage that the several measuring-channel assemblies are operated at the same frequency. The relative phase in every measuring-channel assembly of the measuring device is corrected by taking the clock signal as the basis for the phase reference. The phase-corrected assembly clock signal provided for the further measuring task has an identical phase position in each of the measuring-channel assemblies of the measuring device. Even difficult measuring tasks, for example, in modern mobile-radio systems, can therefore be implemented using a multi-channel measuring system of this kind.

In particular, it is advantageous that the phase-corrector element of every measuring-channel provides a phase detector. In order correct the phase position of the assembly clock signal, the assembly clock signal, or an output clock signal generated from it, and the clock signal of the measuring device is supplied within the phase detector. The output clock signal in this context is the signal, which is generated from the assembly clock signal in each measuring-channel assembly, for example, by a divider.

Furthermore, it is advantageous that a control signal is generated by the phase detector for the control of a controllable phase shifter. The phase shifter is also a component of the phase-corrector element and connected to the phase detector. The correction of the phase position of the assembly clock signal is therefore implemented within every measuring-channel assembly. Accordingly, a reference signal can be supplied to the measuring-channel assemblies as an assembly clock signal, because, independently of the delay time displacements, which occur, for example, as a result of different arrangements of the measuring-channel assemblies within the measuring device, the necessary phase correction can be determined in the local environment by the phase detector in the phase-corrector element. The reference signal as an assembly clock signal is corrected with regard to its phase position so to speak in-situ within the measuring-channel assembly and is then available in a synchronous manner for a measuring task of the measuring-channel assemblies.

Alternatively, it is also possible to provide a controllable oscillator, which generates the assembly clock signal internally in the measuring-channel assemblies.

Furthermore, it is advantageous to superimpose a marking on the clock signal, which is generated in the measuring device in common for the individual measuring-channel assemblies. The marking provides a relatively lower frequency, for example, by comparison with the clock signal. As a result of this lower frequency, it is possible to synchronize a control for a common timing point for different processing steps. With a relatively slower timestamp of this kind, which is impressed or superimposed on the clock signal by means of the marking, a measuring software can, for example, be time-controlled. This can read out the slower timestamp signal in order to implement the measuring task or can convert it into control instructions.

The clock signal is preferably generated from a reference signal. For example, a high-frequency reference signal, which is generated in the measuring device or supplied to the latter, can be divided down to a lower frequency using a divider. The clock signal of the measuring device generated in this manner from the reference signal then forms the phase reference for the individual measuring-channel assemblies. For this purpose, a clock-signal generator is connected to a reference-signal source as the clock-signal source of the measuring device.

According to the invention, several measuring devices can also be synchronized with one another. For this purpose, it is therefore possible to synchronize not only several measuring-channels within one measuring device including the phase position, but also to do this with several measuring devices in a measuring-device-wide manner, wherein each measuring device can provide several measuring-channels or measuring-channel assemblies. The synchronization of several measuring devices each with only one measuring-channel is also possible. For this purpose, a system-synchronization signal generated by a system-synchronization signal source is transmitted from one measuring device to every further measuring device of the overall measuring system and to the measuring device itself. The delay time of this system-synchronization signal is identical here. In every measuring device, a clock-signal source is available, which generates a clock signal. The clock signal is then corrected, by means of a second phase-corrector element, to the phase position of the system-synchronization signal supplied via a measuring-device input of every measuring device.

To synchronize the individual measuring devices with one another, the clock signal available or generated within every measuring device is corrected with regard to its phase position to the phase position of the supplied system-synchronization signal. To correct the phase position of the clock signal, the supplied system-synchronization signal and the clock signal is supplied in the second phase-corrector element to a phase detector of the second phase-corrector element. In the case of a generation of the clock signal from the reference signal of a measuring device, the reference signal, upon which the clock signal is based and accordingly the clock signal of the measuring device derived from it, is corrected with regard to its phase position.

It should be borne in mind that the features of the synchronization of measuring-channel assemblies within a device and the synchronization of several devices with one another can also be advantageously combined. The synchronization of the devices with one another and the synchronization of the measuring-channel assemblies is based on the same principle. The following explanation is based on a measuring device, which allows both a synchronization with other measuring devices of a system and also of several internal measuring-channel assemblies.

BRIEF DESCRIPTION OF THE DRAWINGS

A preferred embodiment of the invention is presented in the drawings and explained in greater detail in the description below. The drawings are as follows.

DETAILED DESCRIPTION OF EXEMPLARY EMBODIMENTS OF THE INVENTION

Figure 1:
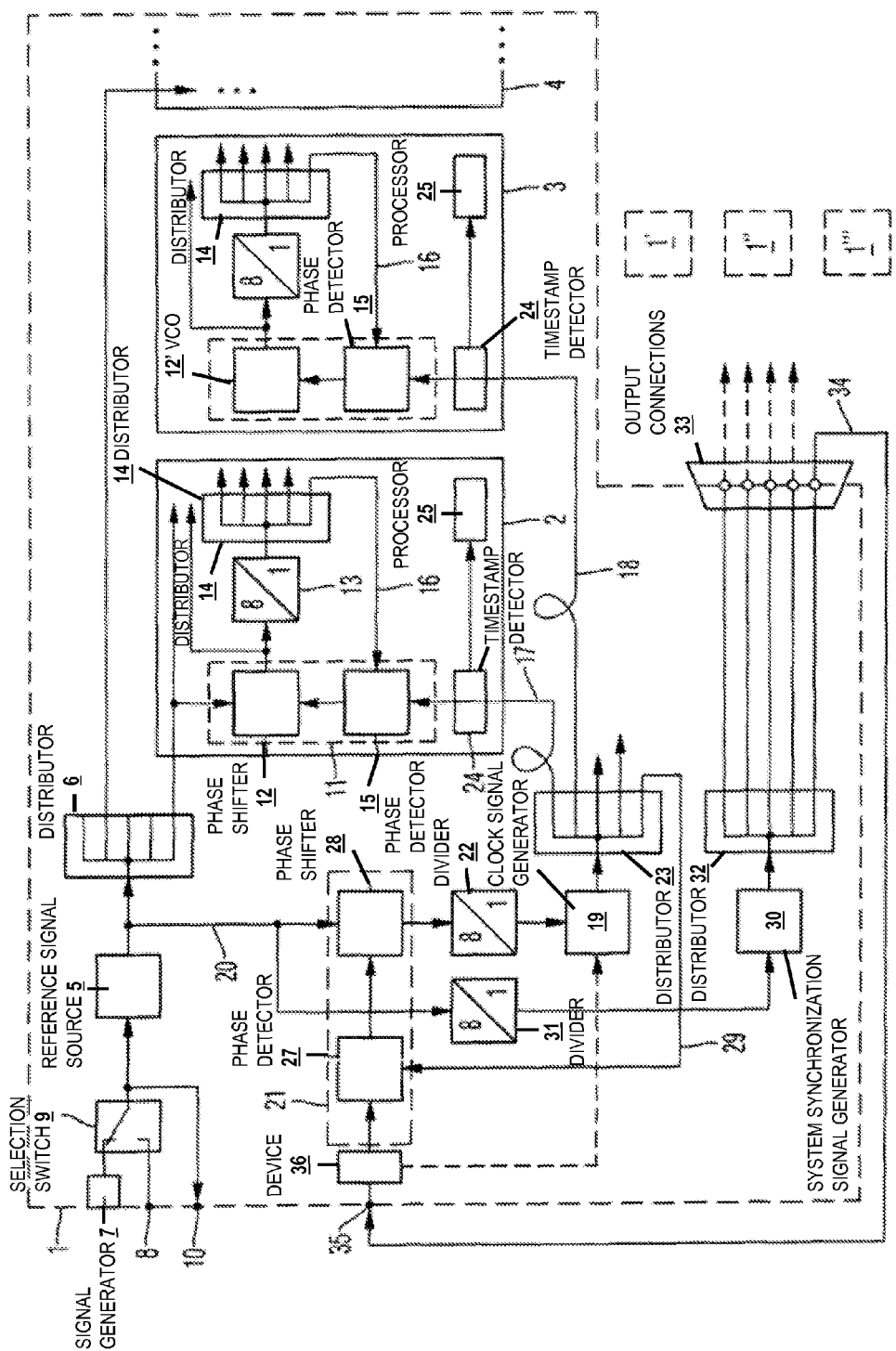
FIG. 1 shows a block-circuit diagram of a measuring device according to the invention with several measuring-channel assemblies and a device for synchronizing several measuring devices with one another.

FIG. 1 presents schematically the structure of a measuring device 1. The measuring device 1 comprises a first measuring-channel assembly 2 and a second measuring-channel assembly 3. As indicated by the further measuring-channel assembly 4, additional measuring-channel assemblies can be arranged in the measuring device 1. The measuring-channel assemblies 2, 3, . . . can be structured in an identical manner with regard to their configuration for synchronizing the measuring-channel assemblies with one another. Via the assemblies or structural elements illustrated in FIG. 1, the measuring-channel assemblies 2, 3, 4, . . . can also provide additional devices corresponding to their respective measuring task. For example, a transmission or reception device can be present in each of the measuring-channel assemblies for communication with a mobile-radio device, which is not illustrated. Evaluation devices, for example for determining block-error rates or bit-error rates in the transmission of data between the measuring device 1 and the connected mobile-radio device can also be present in every measuring-channel assembly or in individual measuring-channel assemblies.

In order to avoid unnecessary repetition, the components present in each case for the synchronization in the measuring-channel assemblies 2, 3, . . . will be explained only with reference to the measuring-channel assembly 2. With regard to the other measuring-channel assembly 3, only differences from the first measuring-channel assembly 2 will be explained.

A reference-signal source 5 is provided in the measuring device 1. This reference-signal source 5 outputs a reference signal, which is used as a basis for the synchronization of the measuring-channel assemblies 2, 3, 4 and several measuring devices with one another. For the synchronization of the measuring-channel assemblies 2, 3, . . . , the reference signal is supplied to a distributor 6. The distributor 6 is partially connected to the individual measuring-channel assemblies 2, 4, . . . and supplies the reference signal to these measuring-channel assemblies 2, 4, . . . . In this context, the delay time of the reference signal to the individual measuring-channel assemblies 2, 4, . . . can be different.

The reference-signal source 5 generates the reference signal on the basis of a supplied signal, as generated, for example, internally within the device by an internal signal generator 7. The reference signal is generated, for example, at 800 MHz, on the basis of this signal, which is supplied to the reference-signal source 5 via a selection switch 9. This high-frequency reference signal provides a good spectral purity, which is advantageous for the further application and, in particular, for the generation of further frequencies or signals derived from the reference signal. Since the reference signal in the case of the measuring device 1 according to the invention need not be supplied in a synchronous manner to the measuring-channel assemblies 2, 4, . . . , the arrangement of the measuring-channel assemblies 2, 4, . . . within the measuring device is variable. The arrangement on a printed circuit board of the measuring device can therefore be implemented according to economic criteria, because an identical delay time of the reference signal between the first distributor 6 and the measuring-channel assemblies 2, 4, . . . is not necessary.

While the signal of the signal generator 7 as illustrated in FIG. 1 is supplied to the reference-signal source 5 via the selection switch 9, a signal input 8 is additionally provided in the measuring device 1. Via the signal input 8, a signal can also be supplied via the selection switch 9 to the reference-signal source 5. This will be explained in greater detail below with reference to FIG. 2. The signal generator 7 is preferably a stable-frequency signal generator, for example, an OXCO ("oven controlled oscillator").

If the signal, upon which the reference signal is based, is generated in an OXCO of this kind of a measuring device 1, the signal can at the same time be supplied to further measuring devices connected to the measuring device 1. For this purpose, the signal is picked up between the selection switch 9 and the reference-signal source 5 and supplied to a signal output 10 of the measuring device 1. The use of this signal output will be explained in greater detail below in the explanation of the synchronization of several measuring devices 1 with one another.

For the synchronization of several measuring-channel assemblies 2, 3, . . . with one another, a first phase-corrector element 11 is arranged in every measuring-channel assembly 2, 3, . . . . The phase-corrector element 11 provides a phase shifter 12, to which the reference signal supplied via the distributor 6 is connected at the input. In the case of the supply of the reference signal, an assembly clock signal is formed by the reference signal. The incoming reference signal is displaced with regard to its phase in the phase shifter 12 before the further processing in the measuring-channel assemblies 2, 4, . . . . The phase-corrected reference signal can, as illustrated by way of example in FIG. 1, either be used directly for further tasks or supplied to a divider 13, after it is output through the phase shifter 12.

As shown for the measuring-channel assembly 2, however, an assembly clock signal can also be generated within the measuring-channel assembly by a controllable oscillator 12'. In the illustrated exemplary embodiment, a low-frequency output clock signal is generated, in both cases through the divider 13, from the assembly clock signal of the measuring-channel assemblies 2, 3.

This output clock signal is supplied to a second distributor 14. Within the second distributor 14 and, in particular, travelling outwards from the second distributor 14 to the other components using the output clock signal as a time basis, an identical signal-path length is now required, so that the output clock signal distributed via the second distributor 14 arrives in phase at all structural units relevant for the measurement. A branch of the second distributor 14 is supplied via a connecting line 16 to a phase detector 15 of the phase-corrector element 11. Accordingly, the output signal, which is initially generated from the reference signal with an unknown phase position, is supplied to the phase-corrector element 11. A clock signal of the measuring device 1 is also supplied to all measuring-channel assemblies 2, 3, 4, . . . , as shown by way of example for the first measuring-channel assembly 2 and the second measuring-channel assembly 3, via lines 17 and respectively 18 with an identical signal path length. Accordingly, this clock signal supplies a signal, which arrives at the measuring-channel assemblies 2, 3, . . . with an identical phase position, to all measuring-channel assemblies 2, 3, 4, . . . . This clock signal is also supplied via the line 17 to the phase detector 15. Accordingly, the phase detector 15 generates a phase difference from the clock signal, which is supplied via the line 17, and from the output clock signal supplied via the connecting line 16. On the basis of this phase difference, a control signal is generated by the phase detector 15, by means of which the controllable phase shifter 12 is controlled. On the basis of this control signal, the incoming reference signal is displaced by the phase shifter 12 in the case of the measuring-channel assemblies 2 and 4 in such a manner that the assembly clock signal and therefore ultimately the output clock signal and the clock signal of the measuring device 1 do not provide a phase displacement. In this context, the clock signal and the output clock signal need not necessarily provide an identical frequency. For example, the signals could also be disposed in an integer ratio relative to one another.

In the case of the generation of the assembly clock signal within the measuring-channel assembly 3 by the controllable oscillator 12', the controllable oscillator 12' is controlled by the phase detector 15. Here also, a division by a divider can be provided. It should be noted that a division can be provided, but that the assembly clock signal itself can also be supplied to the phase detector 15.

Moreover, a signal-path length compensation can be implemented through the connecting line 16, if, for example, the signal path length for the clock signal within the individual measuring-channel assemblies 2, 3, 4 . . . towards the phase detector 15 is different.

The reference signal generated by the reference-signal source 5 is also used as a basis for the generation of the clock signal in the exemplary embodiment presented. For this purpose, a clock-signal generator 19 is connected to the reference-signal source 5 via a line 20 as a clock-signal source. In the clock-signal source 19, the clock signal is generated from the reference signal and supplied to a third distributor 23. The third distributor 23 in this context is structured in such a manner that the clock signal generated in the clock-signal generator 19 is output with identical delay times at the outputs of the third distributor 23. Furthermore, the lines 17, 18, . . . are of identical length, so that the clock signal is supplied to the individual measuring-channel assemblies 2, 3, . . . with an identical phase position. Coaxial cables, for example, can be laid in the measuring device 1 as the lines 17, 18.

Within the connecting line 20, a second divider 22 is provided, which generates from the high-frequency reference signal a relatively-lower frequency, which is then further processed by the clock-signal generator 19 to form a clock signal of relatively-lower frequency. A frequency division of this kind is optional. Through the use of a clock signal of relatively-low frequency, for example, 100 MHz, it is easier to control delay time lengths within the measuring device. The lower-frequency clock signal generated from the reference signal therefore offers the possibility of providing a common time basis for the measuring-channel assemblies 2, 3, . . . , although, for the implementation of the measuring task of each of the measuring-channel assemblies 2, 3, . . . , the high-frequency reference signal is supplied individually or a new assembly clock signal is generated.

A marking can be additionally superimposed on the clock signal by the clock-signal generator 19. A marking of this kind can be implemented by means of a timestamp signal. The superimposition of a timestamp signal can be, for example, a blanking interval provided in a clock signal designed as a square wave signal. This will be explained in greater detail below with reference to FIG. 3. A timestamp signal of this kind is once again reduced with regard to its frequency relative to the clock signal, so that the timestamp signal is supplied to the measuring-channel assemblies 2, 3, . . . with a frequency, which can be processed by a measuring software. In order to register the timestamp in every measuring-channel assembly 2, 3, . . . , a timestamp detector 24 is provided. The timestamp detector 24 recognises the blanking interval and supplies it to further components 25 such as a central processor.

The marking can also be transmitted by means of a protocol. For example, the marking can be implemented through a pulse code modulation.

While the description so far has explained the synchronization of several measuring-channel assemblies 2, 3, . . . within one measuring device, each of the measuring devices 1 is configured in such a manner that several measuring devices 1 can also be synchronized with one another on a common time basis. For this purpose, a second phase-corrector element 21 is provided in the connecting line 20. Using the second phase-corrector element 21, the reference signal used for the generation of the clock signal in every one of the measuring devices 1 is introduced in the connecting line 20 before the generation of the clock signal at an identical phase position. For this purpose, the second phase-corrector element 21 once again comprises a phase detector 27, of which the control connection is connected to a controllable phase shifter 28. The connecting line 20 leads the reference signal to the controllable phase shifter 28, before the reference signal, branched off in this manner, is supplied to the divider 22 or respectively to the clock-signal generator 19. In order to generate the control signal for the controllable phase shifter 28, the third distributor 23 is connected via a clock signal feedback line 29 to the phase detector 27 of the second phase-corrector element 21. The clock signal feedback line 29 is identical in length to the lines 17, 18.

A system-synchronization signal, which is generated via a system-synchronization-signal generator 30 is used by the phase detector 27 as a basis for comparison. The system-synchronization signal is also generated on the basis of the reference signal generated by the reference-signal source 5. For this purpose, the connecting line 20 branches and leads the reference signal generated directly by the reference-signal source 5 via a second divider 31 to the system-signal generator 30. The further divider 31 in this context is once again preferably provided in order to generate a low-frequency system-synchronization signal from the reference signal. The system-synchronization signal generated by the system-synchronization-signal generator 30 is supplied to a fourth distributor 32. The delay times of the system-synchronization signal from the system-synchronization-signal generator 30 are once again identical. Initially, for every branch of the fourth distributor 32, connections are provided from the fourth distributor 32 to measuring-device output connections 33. The number of measuring-device output connections 33 corresponds here to the maximum number of measuring devices 1 to be coupled to one another. Via a feedback line 34, the system-synchronization signal is supplied externally to a measuring-device input 35. For the synchronization of several measuring devices 1 with one another, this is implemented for every one of the measuring devices coupled to one another, as described below in the explanation of FIG. 2. This feedback system-synchronization signal offers the basis for determining the phase position for the clock signal of the measuring devices 1.

In the example, a device-internal third distributor is provided. However, it goes without saying that the system-synchronization-signal source can be connected to a single measuring-device output and a further external distributor can be provided. The decisive factor is that the system-synchronization signal travels an identical signal-path length from the system-synchronization-signal source through to the measuring-device inputs of the connected measuring devices or respectively to the respective phase detector.

For this purpose, the fed-back system-synchronization signal and the internally fed-back clock signal are compared with one another within the phase detector 27. In the event of a deviation in the phase position of these two signals relative to one another, a control signal is output by the phase detector 27 as already in the case of the first phase detector 15. The control signal is supplied to the phase shifter 28 of the second phase-corrector element 21. As a result, the reference signal supplied to the phase shifter 28 is phase-displaced until the fed-back clock signal and the fed-back system-synchronization signal provide a negligible phase difference.

Since a system-synchronization signal of identical phase position is supplied in each case via a system-synchronization-signal feedback line 34 to the measuring devices 1 to be synchronized with one another, the respective device-internal calibration of the clock signal with regard to its phase position on the system-synchronization signal generates synchronous measuring devices. Moreover, on the basis of the clock signal of the individual measuring devices synchronized in this manner with regard to its phase position, a phase correction of the reference signal in the individual measuring-channel assemblies 2, 3, . . . of the measuring devices 1 is implemented. Finally, therefore all measuring-channel assemblies 2, 3, . . . of all measuring devices 1, which are coupled to one another, are identical with regard to their phase position. The measurement can therefore be implemented on an identical time scheme. In this context, for the control of complex measurement tasks, it is also particularly advantageous that a blanking pulse is supplied to the respective clock signal. Once again, in order to implement this measuring-device-wide, a blanking pulse is preferably added by the system-synchronization-signal generator 30 to the system-synchronization signal. This is read out by a corresponding device 36, wherein the result is supplied to the clock-signal generator 19. This generates a blanking pulse in the clock signal of every measuring device 1 on the basis of the blanking pulse of the system-synchronization signal. Accordingly, in each of the measuring devices 1, a blanking pulse, which can be evaluated by the individual measuring-channel assemblies 2, 3, . . . , is present at an identical timing point.

The measuring-device connections 33 can be connected to several measuring devices 1', 1", 1''', as indicated by the further, dotted-line measuring devices. The connection of the measuring devices 1, 1', 1", . . . to one another is presented in FIG. 2 by way of illustration.

Figure 2:
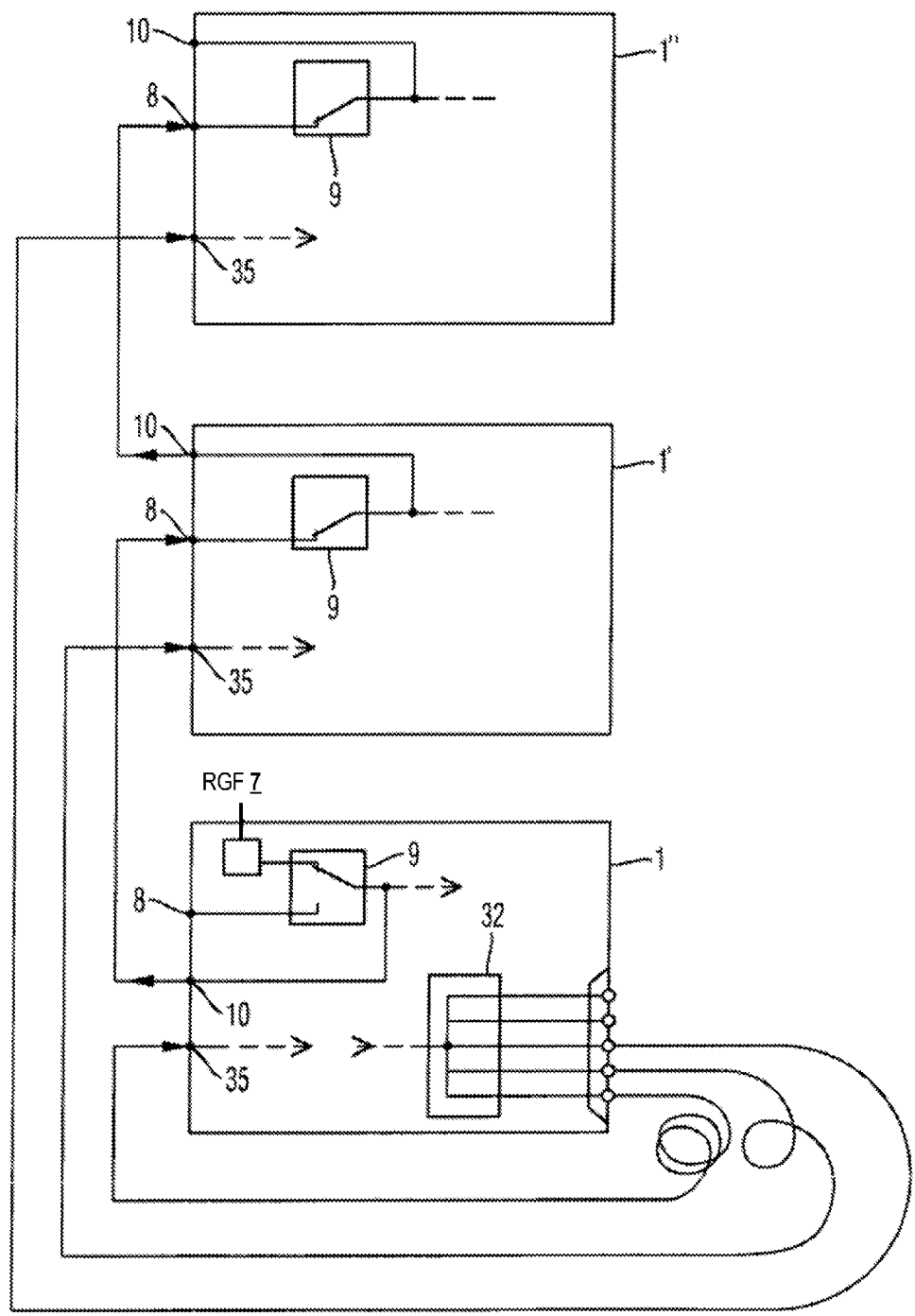
FIG. 2 shows a diagram explaining a synchronization of several measuring devices with one another.

The measuring device 1 shown at the bottom of FIG. 2 corresponds in its structure, as do the other measuring devices 1', 1", to that described in detail in FIG. 1. In this context, the measuring device 1 functions as a "master", while the other measuring devices 1' and 1" are operated as so-called "slave" measuring devices.

On one hand, the signal, upon which the reference-signal sources 5 are based, is generated by the signal generator 7 within a combination of several measuring devices by the measuring device 1. Correspondingly, the reference-signal source 5 of the measuring device 1 is connected to the signal source 7 via the selection switch 9. The signal generated by the signal generator 7 is supplied via the signal output 10 to the signal input 8 of the measuring device 1' and via its signal output 10 to the signal input 8 of the measuring device 1". Accordingly, the selection switches 9 of the measuring devices 1', 1" are disposed in their respectively other position. Starting from the signal of the signal generator 7, all reference-signal sources 5 of the measuring devices 1, 1', 1" therefore generate a reference signal of identical frequency, for example, 800 MHz.

For the synchronization of the individual measuring-channel assemblies 2, 3, . . . of every measuring device 1, 1', 1", a clock signal is generated within the individual measuring devices 1, 1', 1" in a manner described in detail with reference to the measuring device 1. This clock signal, which is generated internally within device, allows the internal synchronization of all measuring-channel assemblies 2, 3, . . . of each measuring device.

By contrast, the synchronization of the several measuring devices 1, 1', 1" is implemented through a system-synchronization signal generated additionally by the "master" measuring device 1. This system-synchronization signal is generated in the manner already explained with reference to the measuring device 1 and provided via the third distributor 32 to several output connections 33. In each case, one of these output connections 33 is connected via a system-synchronization-signal feedback cable 34 to the measuring-device input 35 of the measuring device 1, to the measuring-device input 35 of the measuring device 1' and to the measuring-device input 35 of the measuring device 1". The cables used for the connection of the output connections 33 to the measuring device connections 35 in this context are of an identical length. The delay time of the system-synchronization signals to the individual measuring devices is therefore identical. Accordingly, a calibration of the phase positions of the clock signal in the measuring devices by the respectively second phase-corrector element 21 is made possible via the system-synchronization signal. Since a phase correction of the reference signal and accordingly an internal synchronization of the measuring-channel assemblies 2, 3, ... of a measuring device 1, 1', 1" is then implemented internally, on the basis of the respective phase-corrected clock signal, all measuring-channel assemblies of all measuring devices 1, 1', 1" are finally synchronized with one another.

It is evident that the synchronization of measuring devices is restricted neither to the illustrated number of measuring-channel assemblies of a measuring device nor to the illustrated number of measuring devices.

Figure 3:
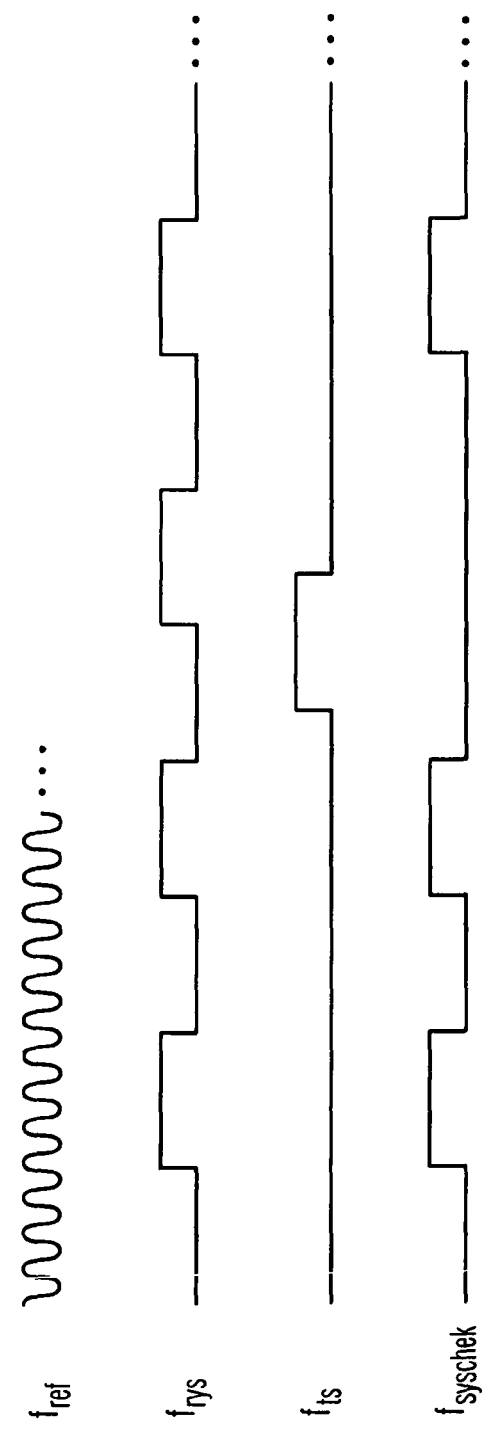
FIG. 3 shows a diagram of the signals used within the system for the synchronization.

FIG. 3 illustrates by way of example how the signals required to synchronize the devices or respectively the measuring-channel assemblies 2, 3, ... with one another are generated from a common reference signal. The starting point is a reference signal $F_{ref}$ of, for example, 800 MHz. This signal is of high spectral purity and is used as a basis for generating a selectable time raster of the measuring-channel assemblies 2, 3, ... and of the clock signal $F_{sys}$. The clock signal $F_{sys}$ is generated by the clock-signal generator 19 on the basis of a frequency-divided reference signal $F_{ref}$ and has a frequency, for example, of 100 MHz. A timestamp signal $F_{ts}$ is also superimposed on this clock signal $F_{sys}$, which now provides, for example, a frequency of only 1 kHz. Upon the occurrence of a timestamp signal, a blanking pulse in the clock signal is generated by the clock-signal generator 19, before the modified clock signal $F_{sys\ CLK}$ is finally output by the clock-signal generator 19.

In a similar manner, the system-synchronization signal is also generated starting from the reference signal. In this context, a timestamp signal can also be superimposed on the system-synchronization signal. On the basis of this superimposed timestamp signal, it is possible to position all timestamps in the individual measuring devices 1, 1', 1" identically in time.

Through the device-wide system synchronization to the system-synchronization signal, internal delay time differences of the individual measuring devices are compensated by the distribution of an in-phase system-synchronization signal. Since this is also implemented for the different, internal delay times of the reference signals towards the measuring-channel assemblies 2, 4, ... , a device-wide system synchronization of all measuring-channel assemblies 2, 3, 4, ... is achieved.

The invention is not restricted to the exemplary embodiment presented. In particular, it is possible to combine individual features of the example shown with one another in an advantageous manner.

The invention claimed is:

1. A method for synchronizing several measuring devices, wherein each measuring device includes at least two measuring channel assemblies, the method comprising the steps of:
   generating a system synchronization-signal by a system-synchronization generator with a measuring device;
   providing the system-synchronization signal to every measurement device and to a measuring device input of the measuring device, wherein delay times of the system-synchronization signal to all the measuring devices are the same;
   generating a clock signal by a clock signal generator to each of the at least two measuring-channel assemblies; and
   correcting a phase position of the clock signal of the measuring device to be identical to a phase position of the system-synchronization signal,
   wherein the system-synchronization signal is fed back externally to the measuring device input of the measuring device via a measuring device output connection.

2. The method according to claim 1,
   wherein the phase position of the clock signal of the measuring device is corrected to be identical to the phase position of the provided system-synchronization signal.

3. The method according to claim 2,
   wherein the method further comprises the steps of:
   providing the phase position of the corrected clock signal to the measuring-channel assemblies, wherein delay times of the clock signal to the measuring-channel assemblies are of the same length;
   generating an assembly clock signal in each of the measuring-channel assemblies; and
   correcting a phase position of the assembly clock signal in every measuring-channel assembly to the phase position of the clock signal.

4. The method according to claim 3,
   wherein the method further comprises the step of generating a reference signal by a reference signal source to the clock signal generator, the system-synchronisation generator, and each of the measuring-channel assemblies.

5. The method according to claim 3,
   wherein the assembly clock signal is generated by a phase detector or a controllable oscillator.

6. The method according to claim 1, wherein the method further comprises the steps of:
   providing the phase position-corrected clock signal to the measuring-channel assemblies, wherein delay times of the clock signal to the measuring channel assemblies are of the same length;
   generating an assembly clock signal in each of the measuring-channel assemblies; and
   correcting a phase position of the assembly clock signal in every measuring channel assembly to the phase position of the clock signal.

7. The method according to claim 6,
   wherein the method further comprises the step of generating a reference signal by a reference signal source to the clock signal generator, the system synchronization generator, and each of the measuring-channel assemblies.

8. The method according to claim 6,
   wherein the assembly clock signal is generated by a phase detector or a controllable oscillator.

9. The method according to claim 6,
   wherein the clock signal generated from the clock signal generator and the respective assembly clock signal generated from each of the measuring-channel assemblies are supplied to a phase detector.

10. The method according to claim 9,
    wherein a control signal is used for controlling a controllable phase shifter generated by the phase detector.

11. The method according to claim 10,
    wherein a reference signal is supplied to an input of the controllable phase shifter.

12. The method according to of claim 10,
    wherein the assembly clock signal is generated by a controllable oscillator, to which the control signal of the phase detector is supplied.

13. The method according to claim 6,
    wherein a marking is superimposed on the clock signal.

14. The method according to claim 6,
    wherein the clock signal is generated from a reference signal.

15. A measuring device comprising:
    a clock signal generator for generating a clock-signal;
    a system-synchronization-signal generator for generating a system synchronization signal to output;

at least one measuring-device output connection to the measuring device;
a phase-corrector element for matching a phase position of the clock signal; and
a measuring-device input connected to the phase-corrector element for matching the phase position of the clock signal to be identical to a phase position of the system synchronization signal supplied externally via the at least one measuring-device output connection.

16. The measuring device according to claim 15,
wherein the measuring device further comprises a reference-signal source for generating a reference clock signal to the clock signal generator and to the system-synchronization-signal generator.

17. The measuring device according to claim 16,
wherein the measuring device further comprises at least two measuring-channel assemblies each coupled to the reference-signal source and the clock signal generator for providing an assembly-signal source for the generation of an assembly clock signal, wherein each measuring-channel assembly comprises a phase-corrector element for matching a phase position of the assembly clock signal to the phase position of the clock signal.

18. The measuring device according to claim 17,
wherein the phase-corrector element of every measuring-channel assembly comprises a phase detector.

19. The measuring device according to claim 18,
wherein the phase-corrector element further comprises a phase shifter or a controllable oscillator which is connected to the phase detector.

20. The measuring device according to claim 19,
wherein the reference-signal source is connected to an input connection of the phase shifter of every measuring-channel assembly.

\* \* \* \* \*